Nov. 28, 1967 W. B. BRUENE 3,355,667
AUTOMATICALLY TUNED COUPLED RESONANT CIRCUITS
Filed Dec. 16, 1965 4 Sheets-Sheet 1

INVENTOR.
WARREN B. BRUENE
BY
Moody and Kittinger
ATTORNEYS

Nov. 28, 1967 W. B. BRUENE 3,355,667

AUTOMATICALLY TUNED COUPLED RESONANT CIRCUITS

Filed Dec. 16, 1965 4 Sheets-Sheet 2

INVENTOR.
WARREN B. BRUENE

BY

ATTORNEYS

WARREN B. BRUENE
BY
Moody and Kitzinger
ATTORNEYS

INVENTOR.
WARREN B. BRUENE
BY
Moody and Kiutzinger
ATTORNEYS

United States Patent Office 3,355,667

Patented Nov. 28, 1967

3,355,667
AUTOMATICALLY TUNED COUPLED RESONANT CIRCUITS

Warren B. Bruene, Richardson, Tex., assignor to Collins Radio Company, a corporation of Iowa Filed Dec. 16, 1965, Ser. No. 514,288
11 Claims. (Cl. 325—174)

ABSTRACT OF THE DISCLOSURE

A coupled resonant transmitter RF power output network with automatic tuning. This is with automatic tuning of a resonant secondary circuit relative to a resonant primary circuit as determined by deviations from normally a 90 degree phase relationship between a voltage signal sensed in the resonant primary circuit and a voltage signal sensed in the resonant secondary circuit. The system also includes a tunable capacitor in the resonant primary circuit adjustable by a tuning servo loop including an RF phase detector having input connections to RF signal input and output elements of the RF signal power amplifying final output stage; and a L-network matching section loading coil, adjustable by a loading servo loop including an RF signal voltage ratio detector having input connections to the same two elements, the RF signal input and output elements of the RF signal power amplifying final output stage, as the RF phase detector so connected.

Figure 1:
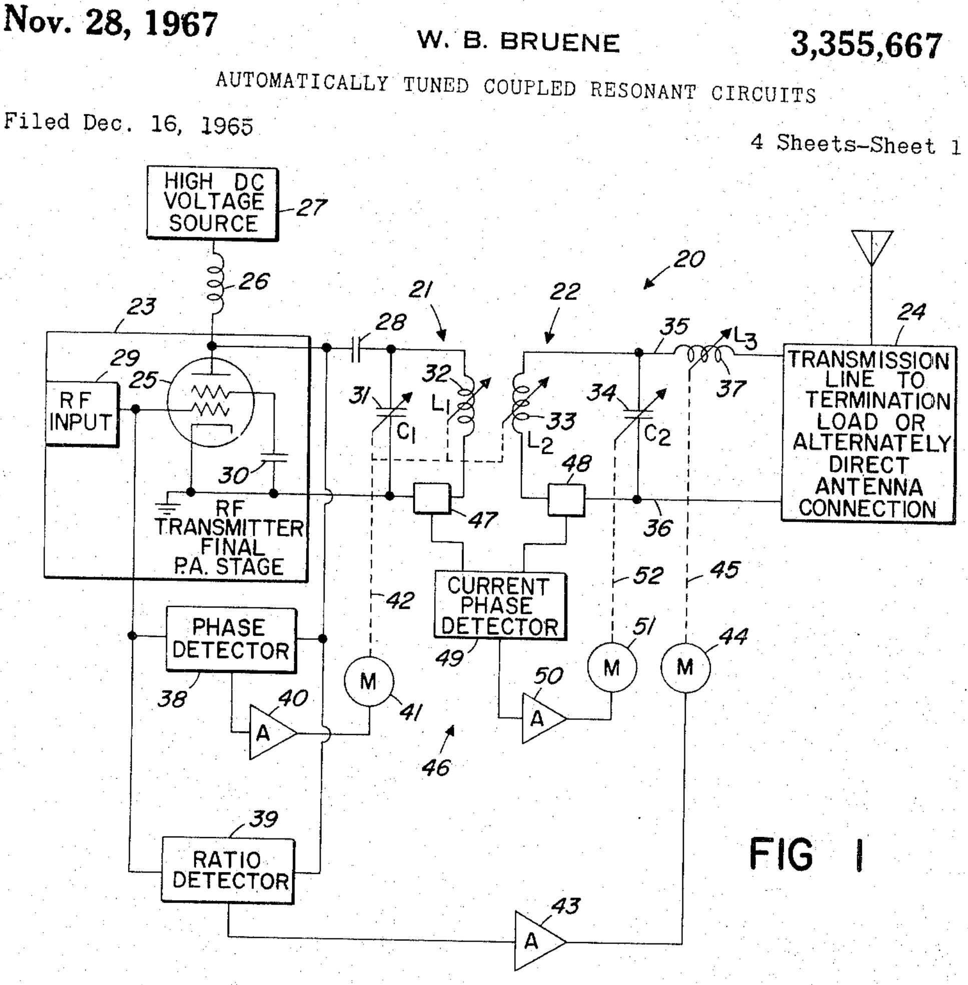

This invention relates in general to radio frequency transmitter power output networks, and in particular, to RF transmitter output networks employing coupled resonant circuits and to automatic tuning of the coupled resonant circuits.

Various medium powered high frequency radio transmitters constructed in the past commonly employed pi type output networks since operationally they were tunable over a relatively wide frequency range, generally provided a reasonably wide load impedance matching range, and in one such circuit approach, required only three reactive elements. Approximately the year 1950 marked a turn from the use of open wire transmission lines and direct coupled antennas, to systems utilizing coaxial transmission lines for transmission of RF transmitter output power to a system antenna. This was a system improvement with many advantages particularly with respect to shielding, filtering, and generally containing RF signal fields within the station.

Requirements for higher harmonic attenuation led to pi–L output networks as very practical output network circuits providing more harmonic attenuation. Further, these pi–L output networks permitted a more suitable operating design and choice of tuning elements for matching the lower impedance load presented by coaxial transmission lines. A quite important feature with some such pi–L output circuit networks is that they can be tuned and loaded with only two tuning controls particularly with ganging of tunable elements with tuning controls of such circuits. Servo control systems were devised and ultimately came into use for automatically tuning these pi–L output circuit networks. This did not always provide the range of tuning desired and some transmitters further employed band switching and some employed various means of course positioning of all variable or switched elements to approximately the correct setting for a given radio frequency.

In such circuits, utilizing two turning control shafts, sensors were employed to control the servos used for driving the shafts for turning and loading functions. Information sensed for turning was generally the phase angle of the load presented to the final stage power amplifier tube anode. A phase detector was employed to detect the phase angle between the control grid and anode of such systems and when this angle was 180 degrees the tube had a resistive load. The magnitude of the load resistance on the anode is, in these systems, automatically adjusted by the loading servo. In instances where the amplifier tube is used as a linear amplifier, the tube gain from RF voltage on the control grid to the RF voltage on the anode (or plate) is used for this indication. When the load resistance with the systems is too low, the ratio of anode voltage to grid voltage is too low, and vice versa. With these pre-existing systems, RF voltage detectors on the grid and anode circuits are employed to obtain this control voltage for the loading servo in accordance with what has been well known to those skilled in the art. When the power amplifier tube with such systems is used as a class C amplifier, the correct RF load is determined by either the correct ratio of DC anode current to DC anode voltage or the correct ratio of DC anode current to RF anode voltage. Requirements for further reduction of harmonic output than has been obtained with these pre-existing systems has led to FCC regulations calling for a reduction of all harmonics to a level below the fundamental of 43 $\log_{10}$ power in db up to a maximum of 80 db, a requirement also paralleled of late by military specification requirements with transmitter output circuitry. With various transmitter RF output networks with medium and high power transmitters, vacuum variable capacitors are generally most essential, although quite costly.

It is, therefore, a principal object of this invention to provide a transmitter RF signal coupled resonant power output network with substantial db reductions of all RF harmonics to a high degree, for example, 80 db or more.

A further object with such a transmitter coupled resonant RF output network is to minimize the numerical requirement for RF elements and to minimize design and circuit costs without any sacrifice in performance.

Another object is to minimize the numerical circuit requirement for vacuum variable capacitors in such medium and high power transmitter RF output network circuits.

A further object is simplicity and to optimize adaptability to automatic turning for such circuits.

Another object is to provide a bandpass type transmitter RF output network to minimize or eliminate crosstalk and facilitate coupling to other transmitter antenna systems.

A further object is to obtain bandpass characteristics sufficiently good to permit parallel connection of two transmitters to a common antenna when the frequency of one transmitter is within a range of from 1.3 to 3 of the frequency of the other transmitter.

Features of this invention useful in accomplishing the above objects include, in a coupled resonant transmitter RF power output network, the attainment, with a minimum number of RF elements and reduced circuit cost, of a reduction of harmonics to levels below 80 db under the power level of the transmitter fundamental frequency. It features medium and high power transmitter RF power output networks that in one construction uses only two vacuum variable capacitors. Various embodiments of the output networks are considerably simplified over pre-existing output networks and are particularly adaptable to automatic tuning. This is particularly important with respect to the automatic tuning of a resonant secondary circuit in the output network relative to a resonant primary circuit in the output network as determined by sensed deviations from normally a 90 degree phase relationship between voltages across a capacitor in the resonant primary circuit and across a capacitor in the resonant secondary circuit. The passband characteristics of applicant's transmitter RF power output networks is sufficiently good that two transmitters may be parallel connected to a common antenna where the frequency of one is within a ratio range of 1.3 to 3 of the frequency of the other transmitter. The output network is such that it may be directly connected to, for example a 32-foot hut-mounted whip antenna, although below approximately 4 mc some additional load coil inductance is required. This output network is excellent for transportable transmitters since it can feed a 32-foot whip antenna until a better antenna can be erected when the transmitter has been moved to a new location. The ability to operate without excessive crosstalk in crowded antenna environments and to even diplex onto a common antenna with other transmitters are very valuable features with various embodiments of applicant's output networks particularly with, at times, frequent circumstances that require such varied usage.

Specific embodiments representing what are presently regarded as the best modes for carrying out the invention are illustrated in the accompanying drawings.

Figure 2:
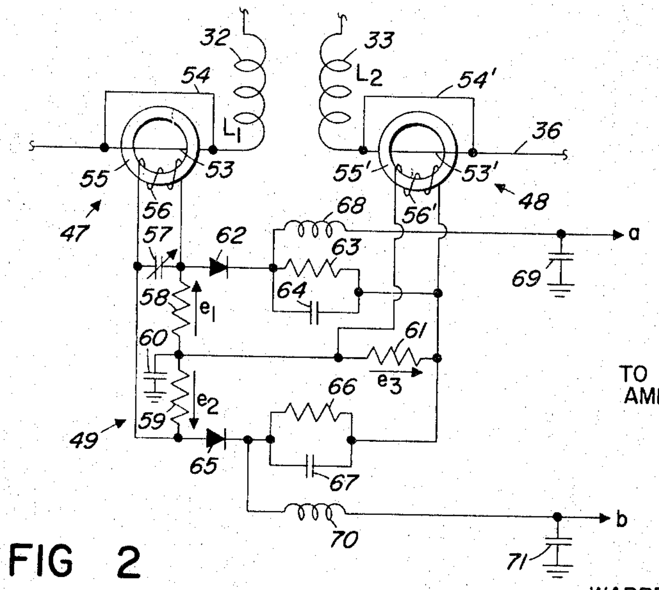
Figure 3:
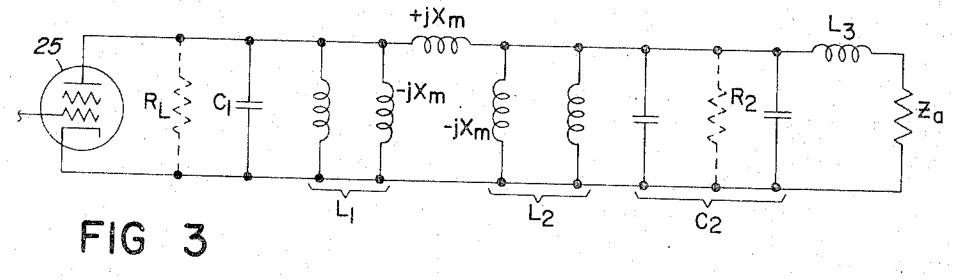
Figure 4:
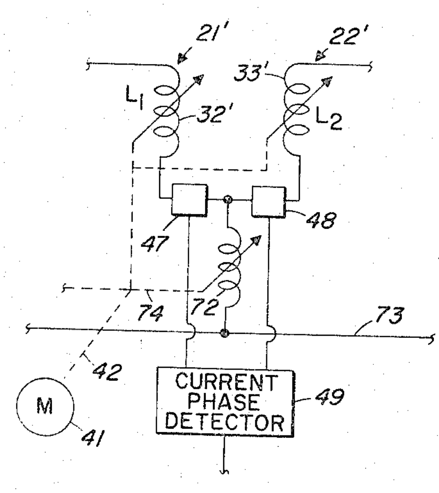
Figure 5:
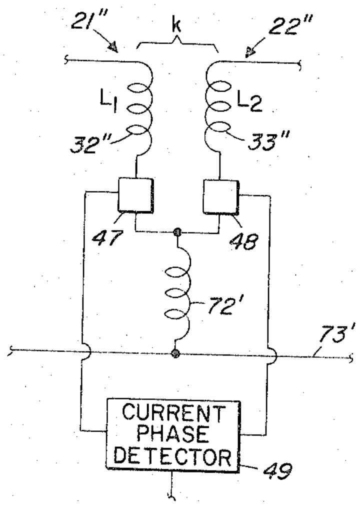
Figure 6:
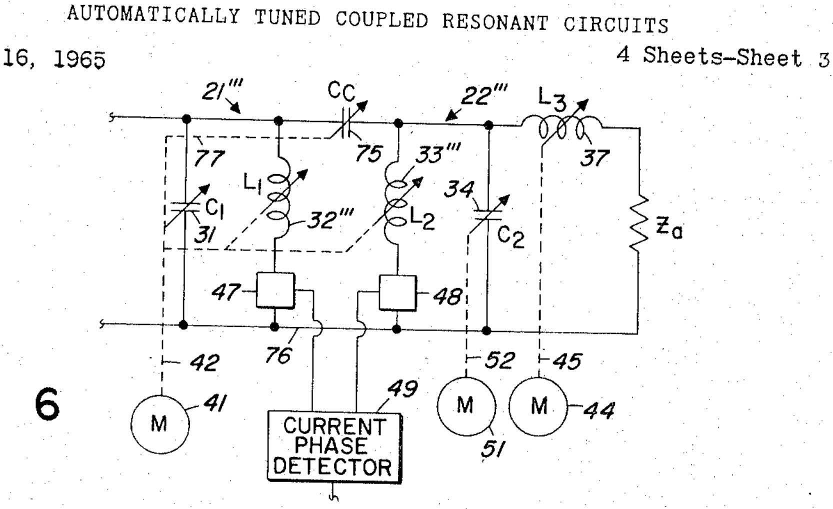
Figures 7, 8:
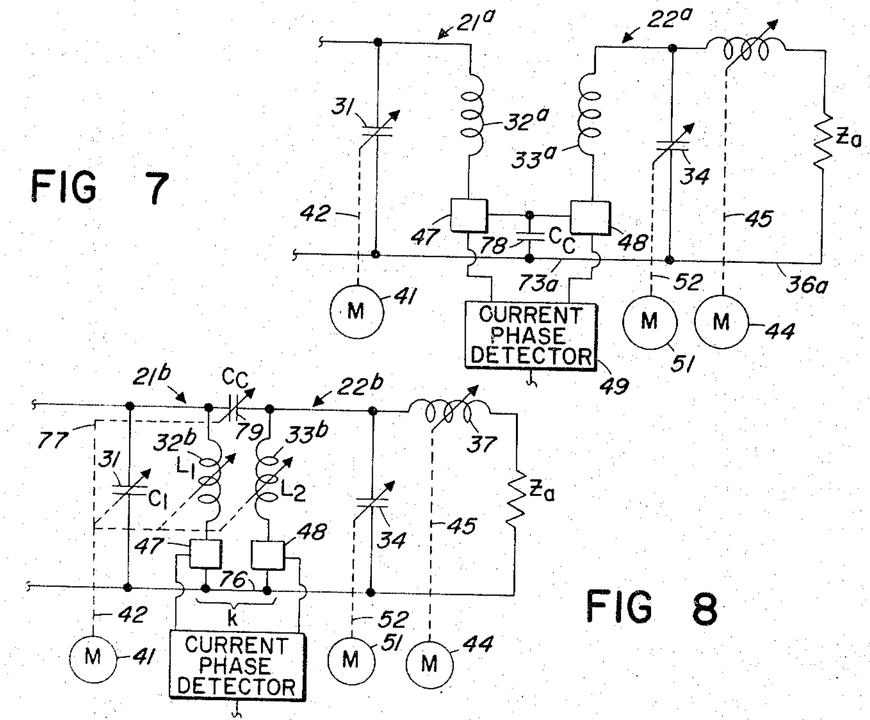
Figure 9:
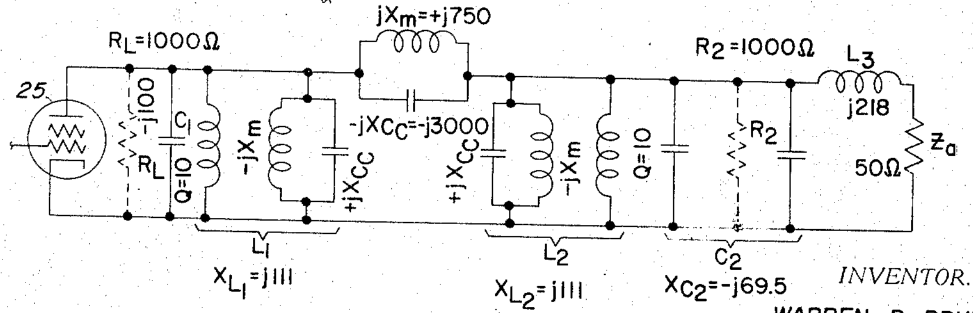
Figure 10:
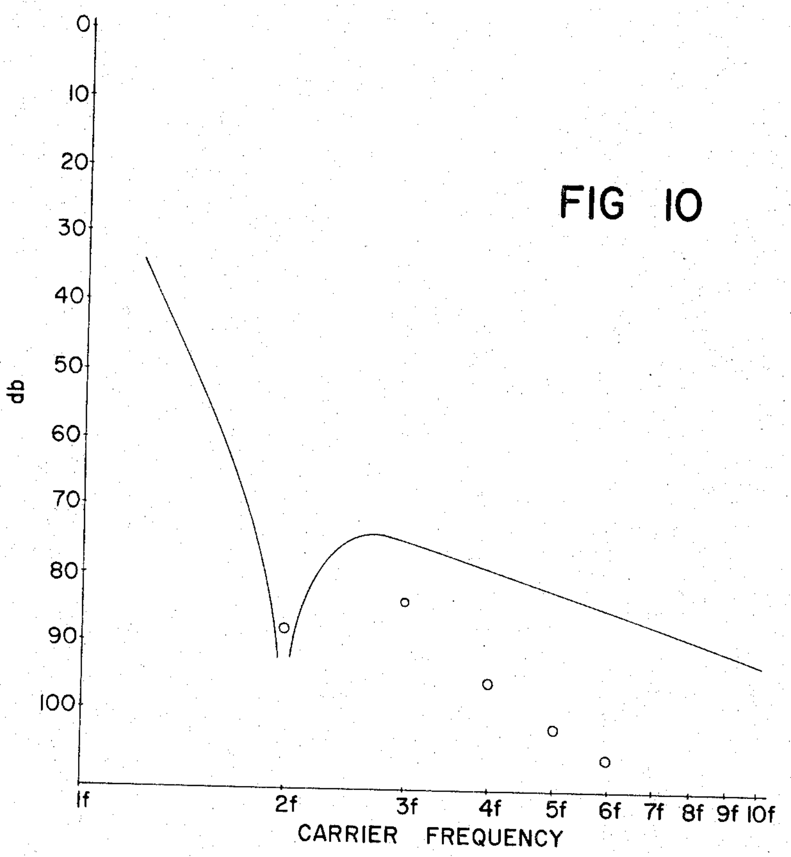
Figure 11:
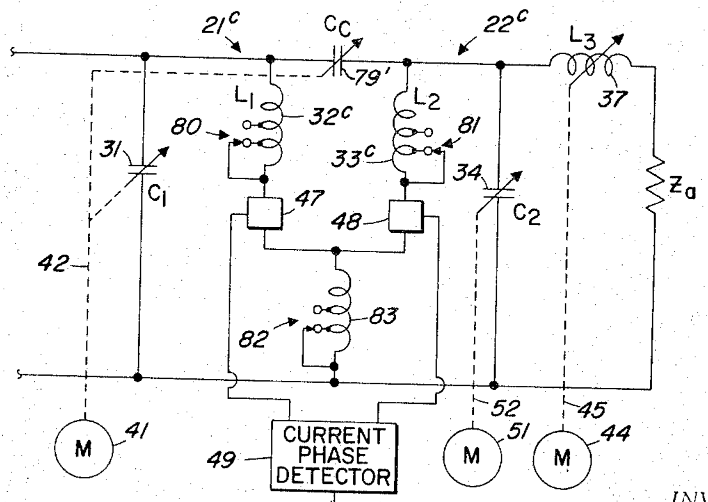

In the drawings:

FIGURE 1 represents a schematic of a servo tuned inductively coupled resonant primary circuit and resonant secondary circuit transmitter RF power output network;

FIGURE 2, a detailed schematic of a phase detector control circuit used in a tuning circuit for servo tuning control of the tuned resonant secondary circuit of the output network of FIGURE 1;

FIGURE 3 is an analytical equivalent circuit for the basic circuit network of FIGURE 1 with the inductive coupling replaced by a pi equivalent for instruction and convenience of explanation in analytical analysis of the basic coupled circuit network;

FIGURE 4, a partial schematic of a common inductance coupling embodiment;

FIGURE 5, a partial schematic of an embodiment with a combination of mutual inductance and a common inductance coupling element;

FIGURE 6, is a partial schematic of an embodiment utilizing top capacitive coupling;

FIGURE 7, a schematic of a common capacitive-reactance coupling circuit;

FIGURE 8, a schematic of an embodiment employing both capacitive and inductive coupling for producing a null at the second harmonic of the fundamental frequency coupled;

FIGURE 9, a circuit equivalent of the dual coupling embodiment of FIGURE 8 for convenience of analysis and understanding;

FIGURE 10, a harmonic attenuation graph illustrating the null effect at the second harmonic obtained with use of the circuit of FIGURE 8; and, FIGURE 11, a schematic of an embodiment with top capacitive coupling added to common inductance coupling.

Referring to the drawings:

The transmitter RF power output network 20, including inductively coupled resonant primary circuit 21 and resonant circuit 22, is shown to connect the output of RF transmitter final power amplifier stage 23 to a transmission line to termination load, which may be an antenna, or alternately, antenna connection 24. RF power amplifier tube 25, which may be a single tube or multiple power amplifier tubes in parallel of the RF transmitter final power amplifier stage 23 is shown to have a cathode connection to ground although it could have a connection to a minus voltage supply and an RF by-pass to ground through a capacitor (detail not shown). The plate of tube 25 has a bias voltage connection through RF choke coil 26 to a high DC voltage source 27, and the plate also has a high voltage RF coupled signal output feedthrough capacitor 28 of output network 20. RF input signal source 29 of previous staging of an RF transmitter supplies the RF input signal to the control grid of final stage power amplifier tube 25. Another grid of the final stage power amplifier tube 25 is connected through capacitor 30 to ground. In the power output network 20, the connection from the plate of final stage power amplifier tube 25 to the resonant primary circuit 21 is through capacitor 28 to capacitor 31 and coil 32, and through capacitor 31 and coil 32, in parallel, to ground.

The resonant secondary circuit 22 includes coil 33, positioned in inductive mutual signal coupling relationship with coil 32 of the resonant primary circuit 21, and a capacitor 34 connected in parallel with coil 33 between line 35 and line 36 which may be connected to ground, although not necessarily so. Line 35 is connected through an L-network matching section coil 37 to transmission line or antenna connection 24. Line 36 is shown to also extend to transmission line or antenna connection 24 although, if there is a circuit line 36 ground connection for circuit 22, there would also be a ground connection for the transmission line termination load or antenna connection 24.

Servo tuning and loading circuits are illustrated with the embodiment of FIGURE 1 and these entail a connection from the power amplifier tube 25 control grid RF signal input line to both a phase detector 38 and to a ratio detector 39. The plate output terminal of final stage power amplifier tube 25 also is provided with signal input connections to both the phase detector 38 and the ratio detector 39. The ratio detector 39 is shown to have an output connection to a servo amplifier 40 which is provided with output power controlling servo signal convening means to tuning motor 41. This servo tuning motor is provided with a mechanical drive 42 for automatic tuning of capacitor 31 and may be provided with drive extensions for ganged servo tuning drive of coil 32 of the resonant primary circuit 21 and coil 33 of the resonant secondary circuit 22. The ratio detector 39 has signal output connective means to servo amplifier 43 which in turn is provided with output signal conveying means to servo signal control motor 44 which is provided with an output mechanical drive 45 connection for servo setting of adjustable coil 37.

An additional secondary tuning servo loop 46 is provided for controlled servo setting of capacitor 34 and thereby tuning of the resonant secondary circuit 22. This servo loop 46, which is a particularly significant contribution by applicant, includes a current sensing pickup 47 in the line between coil 32 and its connection with ground, and a current sensing pickup 48 in the line connection between coil 33 and line 36 of the resonant secondary circuit 22. The outputs of current sensing pickups 47 and 48 are applied as inputs to a current phase detector 49 having an output connection to servo amplifier 50. The servo controlling signal output of amplifier 50 is passed through connective means to a resonant secondary circuit tuning motor 51 having a mechanical output drive connection 52 to the tuning element of tunable capacitor 34.

Please refer also to FIGURE 2 for greater detail of the current sensing pickups 47 and 48 and the current phase detector 49 and portions of the additional secondary servo tuning loop 46. Current sensing pickup 47 is a toroid core type transformer with the primary being the lead 53 from the base of coil 32 to ground with lead 53 shown to have a shunt branch 54 with the transformer sensing only a portion of the current or, if shunt branch 54 were omitted, as could be the case, sensing all the current through coil lead line 53. The toroid core 55 of transformer 47 is equipped with a secondary coil winding 56 with opposite ends connected as inputs to the current phase detector 49.

Current sensing pickup 48 is substantially identical with the corresponding current sensing pickup 47 and duplicated portions will be given primed numbers rather than new numbers as a matter of convenience. Current sensing pickup 48 is also a toroid core type transformer with the primary being line 36 adjacent to the line connection with an end of coil 33 of the resonant secondary circuit 22. Line 36 is shown to have a transformer primary branch 53' corresponding to the lead 53 in the other current sensor transformer 47 and to include a shunt line 54'. Here again, the toroid core 55' is equipped with a secondary coil winding 56′ with opposite ends connected as inputs to the current phase detector 49.

An adjustable phase trimming capacitor 57, which may be in the current phase detector, is connected across the leads from toroid transformer secondary coil 56. Further, the opposite ends of coil 56 are interconnected in current phase detector 49 by two substantially equal value resistors 58 and 59 of relatively low resistance. The common junction of resistors 58 and 59 is connected through capacitor 60 to ground and also directly to one of the ends of secondary coil 56′ of toroid transformer 48 and through a relatively low value resistor 61 to the other lead of transformer secondary coil 56′. One side of the secondary coil 56 of current sensing pickup transformer 47 is connected serially through diode 62 and on through resistor 63 and capacitor 64, in parallel, to the side of the secondary coil 56′ not in direct connection with capacitor 60. In like manner, the other end of toroid transformer secondary coil 56 is connected serially through diode 65 and on through resistor 66 and capacitor 67, in parallel, to the side of the secondary coil 56′ not in direct connection with capacitor 60. Further, in the embodiment shown, diodes 62 and 65 are oriented with anodes connected to opposite ends of transformer secondary coil 56. Further, there are two signal output connections from the current phase detector circuit 49 to servo amplifier 50 one from the cathode of diode 62, through coil 68 and a line including a connection through capacitor 69 to ground, and the other from the cathode of diode 65 through coil 70 and a line including a connection through capacitor 71 to ground.

For a better and further understanding of the basic transmitter output network 20, picture this circuit as having no tunable elements, actually a useful output circuit network with considerable promise. It has been proven that this would be a very efficient output circuit network with capacitor values and coil values carefully selected for operation in relatively narrow predetermined frequency ranges. It is convenient to construct an equivalent circuit, as shown in FIGURE 3, for the basic network circuit. This includes replacement of the two parallel resonant inductively coupled circuits 21 and 22 and the L-network matching section of the fixed value version of output network 20 with a pi equivalent circuit with components as indicated in letters. Several resistive values, $R_L$ and $R_2$ shown in phantom in FIGURE 3, appear in the formula for the value of coupling inductance, $X_M=\sqrt{R_L R_2}$, where $R_L$=plate load resistance and $R_2$ equals equivalent load resistance across $L_2$ and $C_2$, actually coil 33 and capacitor 34 of the resonant secondary circuit 22. The analysis of this equivalent circuit is in accord with conventional textbook type analysis treating coupled inductance and leakage inductance as series instead of equivalent parallel components, with completely detailed analysis not included here. The pi equivalent of the coupling is recognizable as being a 90 degree network at resonant frequency. This 90 degree relation between voltages across capacitors $C_1$ and $C_2$, i.e., capacitors 31 and 34, and across the parallel connected coils $L_1$ and $L_2$, i.e., coils 32 and 33, respectively, is particularly useful as a source for automatic tuning information.

Referring again to FIGURES 1 and 2, capacitor 31 is resonated by a servo loop including phase detector 38, servo amplifier 40, and tuning motor 41 to have a zero phase angle anode load for RF power output tube 25 in accordance with principles relatively well known in the art. A particularly important portion of applicant's contribution is the use of the phase detector circuit 49 to control the servo adjusting of capacitor 34 to the correct value for proper resonance in the resonant secondary circuit 22. When capacitor 34 is properly tuned, the phase difference between voltages across coils 32 and 33 as reflected by the currents sensed by current phase detectors 47 and 48 is 90 degrees as has been pointed out hereinbefore. It is interesting to note that this 90 degree phase difference may be either leading or lagging depending upon the direction of turn windings in coil 33 relative to the direction of turn windings in coil 32. The 90 degree phase detector used in the circuit shown in FIGURES 1 and 2 detects the phase angle between the currents in coils 32 and 33 instead of the voltage across them. Use of other detectors in place of the current sensing detectors such as voltage detectors are considered to be, although not shown, within the scope of this invention as suitable substitutes for use in place of the current sensing detectors 47 and 48 illustrated. With the current sensing pickups 47 and 48 used currents lag voltages by a little less than 90 degrees because of the resistive load components in the coupled inductance. This small phase variance can be compensated for in the detector circuit or neglected since its value is small with high Q circuits.

An automatically tuned coupled resonant circuit as shown in FIGURE 1 and using the current sensing pickups and phase detector circuit of FIGURE 2 has proven to be a very successful working unit operating out of a 3 kw. final power amplifier stage tube 25. This transmitter RF power output network 20 employed a 6800 pf. capacitor 28, a capacitor 31 adjustable from 36 to 1500 pf., and a capacitor 34 adjustable from 50 to 2300 pf. In the current phase detector circuit 49 capacitor 57 is adjustable from 8 to 50 pf., resistors 58 and 59 are 10 ohm resistors, the capacitor 60 value is 0.05 $\mu$f, resistor 61 is 22 ohms, diodes 62 and 65 are type 1N3064, resistors 63 and 66 are 5100 ohm resistors, capacitors 64 and 67 are 4700 pf. capacitors, coils 68 and 70 are 2 mh. coils, and capacitors 69 and 71 are 1,000 pf. capacitors.

With the secondary coils 56 and 56′ output load resistances 58 and 59, and 61 kept relatively low at 10, 10 and 22 ohms, respectively, they are very much less than the secondary coil inductive reactance of coils 56 and 56′. This being the case, current in the load resistances 58, 59 and 61 will be very nearly in phase with the primary currents through the current sensing pickups 47 and 48 and proportional to them. It may be observed from the schematic, FIGURE 2, and a phasor diagram that one may construct with respect thereto, that, when the currents in coils 32 and 33 are 90 degrees apart, the voltages across the two diodes 62 and 65, acting as detectors, are substantially equal. The DC outputs of the two detector diodes 62 and 65 are equal and oppositely polarized such that the net output voltage between the output terminals $a$ and $b$ of the current phase detector circuit 49 is zero when the 90 degree phase relation exists. When capacitor 34 is not in proper tuned adjustment, the phasor voltage $e_3$ shown paralleling resistor 61 in FIGURE 2 will be rotated one way or the other so that the voltages out of the two detector diodes 62 and 65 are no longer equal. This results in a DC output voltage appearing between the terminals $a$ and $b$ with polarity one way or the other depending upon which side of resonance capacitor 34 is adjustably positioned. Such a DC output voltage acting through servo amplifier 50 causes servo motor 51 to run in the direction bringing the adjustable setting of capacitor 34 to a position with secondary resonant circuit 22 in resonance as determined by the 90 degree relationship.

It should be noted that this servo system for setting capacitor 34 cannot lose directive sense to return to desired resonance setting because the currents sensed by current detector 48 in the resonant secondary circuit 22 cannot be more than plus or minus 90 degrees from the correct resonant value. Further, the sensing directional control capabilities of the servo circuit 46 are practically independent of the tuning and loading controls. While magnitude of the output of current phase detector 49 is affected to some extent by the position of the tuning and loading controls, the directional sense is affected very little by variation of the resistive component since this has little effect upon the phase difference. This is particularly significant in that interaction between the three servo systems is practically avoided that might otherwise cause system instability and servo hunting.

The loading servo for servo setting adjustable coil 37 is quite similar in operation to those such as used in pi–L networks referred to hereinbefore except that direction sense of operation is reversed since there is an impedance inverting action through the inductive coupling from resonant primary circuit 21 to resonant secondary circuit 22. To increase load resistance reflected to the anode of tube 25 the effective resistance across the resonant secondary circuit 22 of coil 33 and capacitor 34 must be lowered by reducing the adjustable value of servo set coil 37. Output network 20 has been found to be operationally tunable over a relatively wide frequency range, frequency adjustment is attainable only if coils 32 and 33 are so constructed and positioned that the coefficient of inductive coupling is maintained substantially constant as the settings of the coils are adjusted and the coil inductances are varied, a combination of factors successfully attained. If, on the other hand, a fixed frequency or relatively narrow-band tunable output network is desired fixed value coils could be used, in place of coils 32 and 33, of appropriate value and positioned for the proper value of mutual inductive coupling required with other circuit details substantially the same as in the embodiment of FIGURE 1.

Referring now to the output network embodiment of FIGURE 4, portions of the circuit not shown are substantially the same as in FIGURE 1 and similar elements are numbered the same or with primed numbers. In this embodiment an additional variable inductance coil 72 is provided, connected at the top to both coils 32′ and 33′ and, at the bottom, to a line 73 interconnecting the bottom line of the resonant primary circuit 21′ to bottom line 36 of the resonant secondary circuit 22′. A branch 74 of drive 42 from tuning servo motor 41 is connected to the tuning element of coil 72. The coil 72 is a common inductance coupling for resonant circuits 21′ and 22′, and as such couples substantially the entire signal load from circuit 21′ to circuit 22′ since coils 32′ and 33′ are so spaced that there is substantially no effective mutual inductive coupling directly between them. Further, in this embodiment current sensing pickup 47 is positioned in the line connection between coils 32′ and 72, and current sensing pickup 48 is positioned in the line connection between coils 33′ and 72.

The embodiment of FIGURE 5 utilizes a combination of mutual inductance and common inductance coupling with portions of the circuit not shown being much the same as corresponding portions of the embodiment of FIGURE 1, and with primed numbers indicating similar elements of the other embodiments. In this embodiment coils 32″, 33″, and 72′ may be fixed value components as shown or variable but, the sum of the two couplings, the mutual inductive coupling between coils 32″, and 33″ and the common inductance coupling provided by coil 72′, must total to substantially the correct value. Further, for the two couplings to add, the turn windings in the coils 32″ and 33″ must be in opposite directions just like mirror images of each other. In this embodiment current sensing pickups 47 and 48 are positioned between coil 72′ and coils 32″ and 33″, respectively, and line 73′, connected to the bottom of coil 72′, is a common interconnecting line between the bottom lines of the resonant primary circuit 21″ and the resonant secondary circuit 22″.

In the embodiment of FIGURE 6 top capacitive coupling is employed with substantially all signal coupling between the resonant primary circuit 21‴ and resonant secondary circuit 22‴ being accomplished through the adjustable value capacitor 75 connected between the tops of coils 32‴ and 33‴. This embodiment requires that there be connections from the bottom of both resonant circuits 21‴ and 22‴ to ground, or that they be interconnected as shown by line 76 to provide a circuit return for capacitor 75. The tunable coupling capacitor 75 may be ganged to capacitor 31, coil 32‴, and coil 33‴ by a branch 77 of the servo mechanical drive 42 from servo motor 41 for common tuning control. In this embodiment current sensing pickups 47 and 48 are positioned between the bottoms of coils 32‴ and 33‴, respectively, and the interconnecting line 76, or ground, as the case may be. While design problems with this embodiment are minimized, there is, unfortunately, substantially less harmonic attenuation than with the other inductively coupled embodiments with the coils 32‴ and 33‴ so spaced that there is, practically speaking, substantially no mutual inductance between them.

The embodiment of FIGURE 7 features common capacitive reactance coupling between the resonant primary circuit 21ᵃ and the resonant secondary circuit 22ᵃ. In this embodiment, an additional capacitor 78 is provided connected at its top to both coils 32ᵃ and 33ᵃ and at its bottom to line 73ᵃ interconnecting the bottom line of the resonant primary circuit 21ᵃ to bottom line 36ᵃ of the resonant secondary circuit 22ᵃ. The capacitor 78 is a common capacitive reactance coupling for resonant circuits 21ᵃ and 22ᵃ and as such, couples substantially the entire signal load from circuit 21ᵃ to circuit 22ᵃ since coils 32ᵃ and 33ᵃ are so spaced that there is substantially no effective mutual inductive coupling directly between them. Further, in this embodiment current sensing pickups 47 and 48 are positioned in the line connections between capacitor 78 and coils 32ᵃ and 33ᵃ, respectively. While this circuit provides excellent harmonic attenuation, the value of capacitor 78 must be of such a large value that problems are presented in using variable capacitance at this point in the circuit. Hence, it is shown as being a fixed capacitor (capacitor 78) useful for fixed frequency applications or where its value may be band switched for use at different fixed frequency applications for the output network.

In the additional embodiment of FIGURE 8 a small amount of capacitive coupling, via capacitor 79, is provided in addition to inductive coupling between coils 32ᵇ and 33ᵇ of resonant primary circuit 21ᵇ and resonant secondary circuit 22ᵇ, respectively. This is with the capacitive coupling of top coupling capacitor 79 providing a null in the coupling at a predetermined selected harmonic frequency. This is usually selected to be on or near the second harmonic frequency since the strongest undesired frequency component normally appears at the second harmonic. This embodiment is very similar to the embodiment of FIGURE 6 with, however, coils 32ᵇ and 33ᵇ much more closely spaced in mutually inductive coupling relation. Here again, the capacitor 79 may be gang driven for tuning through a branch 77 of mechanical drive 42 with capacitor 31 and coils 32ᵇ and 33ᵇ. FIGURE 9 shows the embodiment of FIGURE 8 as converted to an equivalent circuit, just as provided with FIGURE 3 for the embodiment of FIGURE 1, as a matter of convenience for analysis of the circuit with basic symbols and equivalent values of a sample circuit indicated on the drawing as a matter of convenience.

With reference to FIGURE 9 along with FIGURE 8, in order to produce a null condition or zero coupling at the second harmonic, the values $+JX_M$ and $-JX_{C_C}$ must be of substantially equal magnitude at the second harmonic. Further, at the fundamental frequency $-JX_{C_C}$ has four times the reactance as $+JX_M$ so, under this condition, the coupling is predominantly inductive at the fundamental frequency, and this net coupling value at the fundamental must, of course, be of the proper value. Referring also to FIGURE 10, various typical values are plotted particularly illustrating the desired null effect at the second harmonic with circuit values in the equivalent circuit as indicated in FIGURE 9. The data dots also plotted show the expected level of the output of a number of successively increased harmonics when a class C power amplifier is used as tube 25. Further, it should be noted that with a linear class AB amplifier the corresponding data dots would all be less than the values plotted. It should be noted that it is necessary that the two couplings, inductive and capacitive, used in the embodiment of FIGURE 8 oppose each other with coils 32$^b$ and 33$^b$ wound in opposite directions so that they are substantially mirror images of each other. A particularly important advantage obtained with the circuit embodiment of FIGURE 8 is that circuit Q's can be nearly cut in half and thereby output network losses substantially cut in half. With these fortuitous results, current in capacitor 31, coils 32$^b$ and 33$^b$ and capacitor 34 is also reduced by such factors to approximately one half of what otherwise would be the case, to result in correspondingly reduced component rating requirements. Further, with the top coupling capacitor 79 being of quite small value, the total network costs may be substantially reduced to a considerable degree. Obviously, here again, substantially the same automatic tuning means may be used as has been described with respect to the embodiment of FIGURE 6. Further, it is not necessary that the adjusted value of capacitor 79 track the ideal value exactly since accuracy within 5 to 10% of the ideal value setting for any particular frequencies within the adjustable range of the output network will produce most of the needed harmonic attenuation nulling. It should be noted that the embodiment of FIGURE 8 could be modified to also include common inductive coupling between the bottom of coils 32$^b$ and 33$^b$ such as illustrated in FIGURE 5 in addition to the top capacitive coupling.

Referring now to the embodiment of FIGURE 11, top capacitive coupling, with a tunable capacitor 79′, is used in conjunction with common inductance coupling for an output network designed for relatively high power output levels, in fact it is presently planned to incorporate such a network for use in a 100 kw. single sideband transmitter power amplifier RF output network. With this embodiment, switch shorting circuits 80, 81 and 82 are used for bandswitching the values of the coils 32$^c$ and 33$^c$, of resonant primary circuit 21$^c$ and resonant secondary circuit 22$^c$, respectively, and with common inductance coupling coil 83. The inductor coils 32$^c$ and 33$^c$ are spaced in this embodiment so that there is substantially no effective mutual inductive coupling between them. Operational bandwidth is, for this embodiment, limited for fixed values of inductance because the effective resistance and voltage across capacitor 34 varies with frequency. This circuit embodiment is particularly useful at higher power levels where variable inductors tend to become impractical.

Whereas this invention is here illustrated and described with respect to several embodiments thereof, it should be realized that various changes may be made without departing from essential contributions to the art made by the teachings hereof.

I claim:

1. In an RF power output network interconnecting an RF signal power amplifying final output stage and terminating means reflecting a load to the RF power output network: a resonant primary L–C circuit including capacitive means and coil means; said resonant primary L–C circuit being connected to said output stage for receiving an RF power output signal from the output stage; a resonant secondary L–C circuit including capacitive means and coil means; said resonant secondary L–C circuit being connected to said terminating means reflecting a load to the RF power output network; and RF signal coupling means positioned for passing RF signals from said resonant primary L–C circuit to said resonant secondary L–C circuit; wherein the capacitive means of said resonant secondary L–C circuit includes a tunable capacitor; first RF signal sensing means connected to said resonant primary L–C circuit; second RF signal sensing means connected to said resonant secondary L–C circuit; at least two-input RF signal phase detecting means having a connection to said first RF signal sensing means as one input, and having a connection to said second RF signal sensing means as the other input; said phase detecting means having output signal connective means to a servo means having connection with said tunable capacitor for servo tuning said tunable capacitor in response to various off phase relations from the predetermined desired phase relation between the resonant primary and resonant secondary circuits when the resonant secondary L–C circuit is properly tuned; the capacitive means of said resonant primary L–C circuit includes a tunable capacitor; a tuning servo loop is connected to the tunable capacitor of said resonant primary L–C circuit and includes a second RF phase detector having a first input connection to an RF signal input element of said RF signal power amplifying final output stage, and having a second input connection to the RF signal output element of said RF signal power amplifying final output stage; said second RF phase detector has output signal connective means to servo means having connection with the tunable capacitor of said resonant primary L–C circuit; the connection between said resonant secondary L–C circuit and said terminating means includes an L-network matching section adjustable loading coil; a loading servo loop is connected to the tunable loading coil and includes an RF signal voltage ratio detector having two input connections from the same two elements of the RF signal power amplifying final output stage as said tuning servo loop; and said RF signal voltage ratio detector has output signal connective means to servo means having connections with the adjustable loading coil.

2. The RF power output network of claim 1, wherein said RF signal coupling means includes coil means of said resonant primary L–C circuit in effective mutual RF signal inductive coupling spaced relation with coil means of said resonant secondary L–C circuit.

3. The RF power output network of claim 2, wherein said coil means of said resonant primary L–C circuit and said coil means of said resonant secondary L–C circuit both include an adjustable inductance coil with both coils having tuning connection with the tuning capacitor of said resonant primary L–C circuit for gang tuning by the servo means of said tuning capacitor of the resonant L–C circuit.

4. The RF power output network of claim 3, wherein an adjustable value RF signal coupling capacitor is connected between the top ends of said coils in mutual inductive coupling spaced relation; with said coupling capacitor having tuning connection with the servo means in servo driving connection with said tuning capacitor of the resonant primary L–C circuit for gang tuning drive with other elements connected to the same servo means; and circuit path means interconnecting the bottom ends of the said coils in mutual inductive coupling spaced relation.

5. The RF power output network of claim 1, wherein the coil means of said resonant primary L–C circuit and the coil means of said resonant secondary L–C circuit each include a coil winding in both of the resonant L–C circuits connected at one end to the respective resonant circuits and having a common connection at their other ends; and including a third common inductance coupling coil connected between the common connection of the two coils having a common connection at one end and circuit path means interconnecting both resonant L–C circuits.

6. The RF power output network of claim 5, wherein the two coil windings connected at one end to the respective resonant circuits and having a common connection are positioned in effective mutual RF signal inductive coupling spaced relation with each other.

7. The RF power output network of claim 5, wherein the two coil windings connected at one end to the respective resonant circuits and having a common connection at their other ends and said third common inductance coupling coil are adjustable coils having common tuning connection with the tuning capacitor of said resonant primary L–C circuit for gang tuning by the servo means of said tuning capacitor of said resonant primary L–C circuit.

8. The RF power output network of claim 5, wherein an adjustable value capacitor is connected between the opposite ends of the coils having a common connection at their ends; and with said adjustable capacitor being an RF signal coupling capacitor having a tuning connection with the tuning capacitor of said resonant primary L–C circuit for gang tuning by the servo means of the said tuning capacitor in the resonant primary L–C circuit.

9. The RF power output network of claim 8, wherein the coils having a common connection and the third common inductance coupling coil are each provided with switch contact setting step value changing shorting circuit means.

10. The RF power output network of claim 1, wherein the coil means of said resonant primary L–C circuit and the coil means of said resonant secondary L–C circuit each include a coil winding in both of the resonant L–C circuits connected at one end to the respective resonant circuits and having a common connection at their other ends; and including a common capacitive reactance coupling capacitor connected between the common connection of the two coils having a common connection at one end and circuit path means interconnecting both resonant L–C circuits.

11. The RF power output network of claim 1, wherein the coil means of said resonant primary L–C circuit and the coil means of said resonant secondary L–C circuit each include a coil winding in both of the resonant L–C circuits; circuit path means interconnecting both coils between one end of each of the coil windings; and including an adjustable capacitive RF signal coupling capacitor connected between the other ends of the coil windings and having a tuning connection with the tuning capacitor of said resonant primary L–C circuit for gang tuning by the servo means of the said tuning capacitor in the resonant primary L–C circuit.

References Cited

UNITED STATES PATENTS

| | | | |
|---|---|---|---|
| 2,376,667 | 5/1945 | Cunningham et al. | 333—17 X |
| 2,502,396 | 3/1950 | Vogel | 325—177 X |
| 3,305,776 | 2/1967 | Duncan et al. | 334—16 X |

JOHN W. CALDWELL, *Primary Examiner.*

B. V. SAFOUREK, *Assistant Examiner.*

UNITED STATES PATENT OFFICE
CERTIFICATE OF CORRECTION

Patent No. 3,355,667

November 28, 1967

Warren B. Bruene

It is hereby certified that error appears in the above numbered patent requiring correction and that the said Letters Patent should read as corrected below.

Column 10, line 42, after "resonant" insert -- primary --; column 11, line 6, after "their" insert -- other --.

Signed and sealed this 10th day of December 1968.

(SEAL)
Attest:

Edward M. Fletcher, Jr.
Attesting Officer

EDWARD J. BRENNER
Commissioner of Patents